(12) United States Patent
Estep et al.

(10) Patent No.: US 6,384,591 B1
(45) Date of Patent: May 7, 2002

(54) HANDS-FREE SIGNAL LEVEL METER

(75) Inventors: Randall S. Estep; Dennis A. Zimmerman, both of Rockingham County, VA (US)

(73) Assignee: ComSonics, Inc., Harrisonburg, VA (US)

( * ) Notice: Subject to any disclaimer, the term of this patent is extended or adjusted under 35 U.S.C. 154(b) by 486 days.

(21) Appl. No.: 08/927,465

(22) Filed: Sep. 11, 1997

(51) Int. Cl.[7] ................. G01R 1/00; G01R 15/00; H04M 3/08
(52) U.S. Cl. ................. 324/111; 324/113; 379/21
(58) Field of Search ................. 324/115, 113, 324/111; 379/21

(56) References Cited

U.S. PATENT DOCUMENTS

| | | |
|---|---|---|
| 4,506,332 A | 3/1985 | Bloch et al. |
| 4,573,187 A | 2/1986 | Bui et al. |
| 4,766,529 A | 8/1988 | Nakano et al. |
| 4,931,950 A | 6/1990 | Isle et al. |
| 5,276,471 A | 1/1994 | Yamauchi et al. |
| 5,281,957 A | 1/1994 | Schoolman |
| 5,291,285 A | 3/1994 | Yokoyama et al. |
| 5,305,244 A * | 4/1994 | Newman ................. 364/708.1 |
| 5,321,416 A | 6/1994 | Bassett et al. |
| 5,408,582 A * | 4/1995 | Colier ................. 395/2.52 |
| 5,426,450 A | 6/1995 | Drumm |
| 5,450,596 A | 9/1995 | Felsenstein |
| 5,528,255 A | 6/1996 | Hagimori |
| 5,581,492 A * | 12/1996 | Janik ................. 364/708.1 |
| 5,671,158 A * | 9/1997 | Fournier ................. 324/409 |

* cited by examiner

*Primary Examiner*—N. Le
*Assistant Examiner*—Anjan Deb
(74) *Attorney, Agent, or Firm*—Whitham, Curtis & Christofferson, P.C.

(57) ABSTRACT

An electrical signal measurement device comprises a system unit which is carried on the person of a technician by attachment to a belt, harness or the like and, in one embodiment, a headpiece incorporating a display, microphone and ear phone. The display, microphone and ear phone are linked to the system unit and supported by software, including a speech recognition system, running on a central processing unit (CPU) which is part of the system unit. In operation, the technician connects a probe to a test point in the cable system, and the technician operates the device by speaking into the microphone. The speech recognition system responds to the technician's spoken words to direct and navigate through a displayed user interface in order to operate the signal level meter measurement functions. Synthesized speech signals are generated to provide user feedback and messages. A signal introduced at the probe is sampled and digitized by the CPU and then formatted for display by the headpiece mounted display.

15 Claims, 16 Drawing Sheets

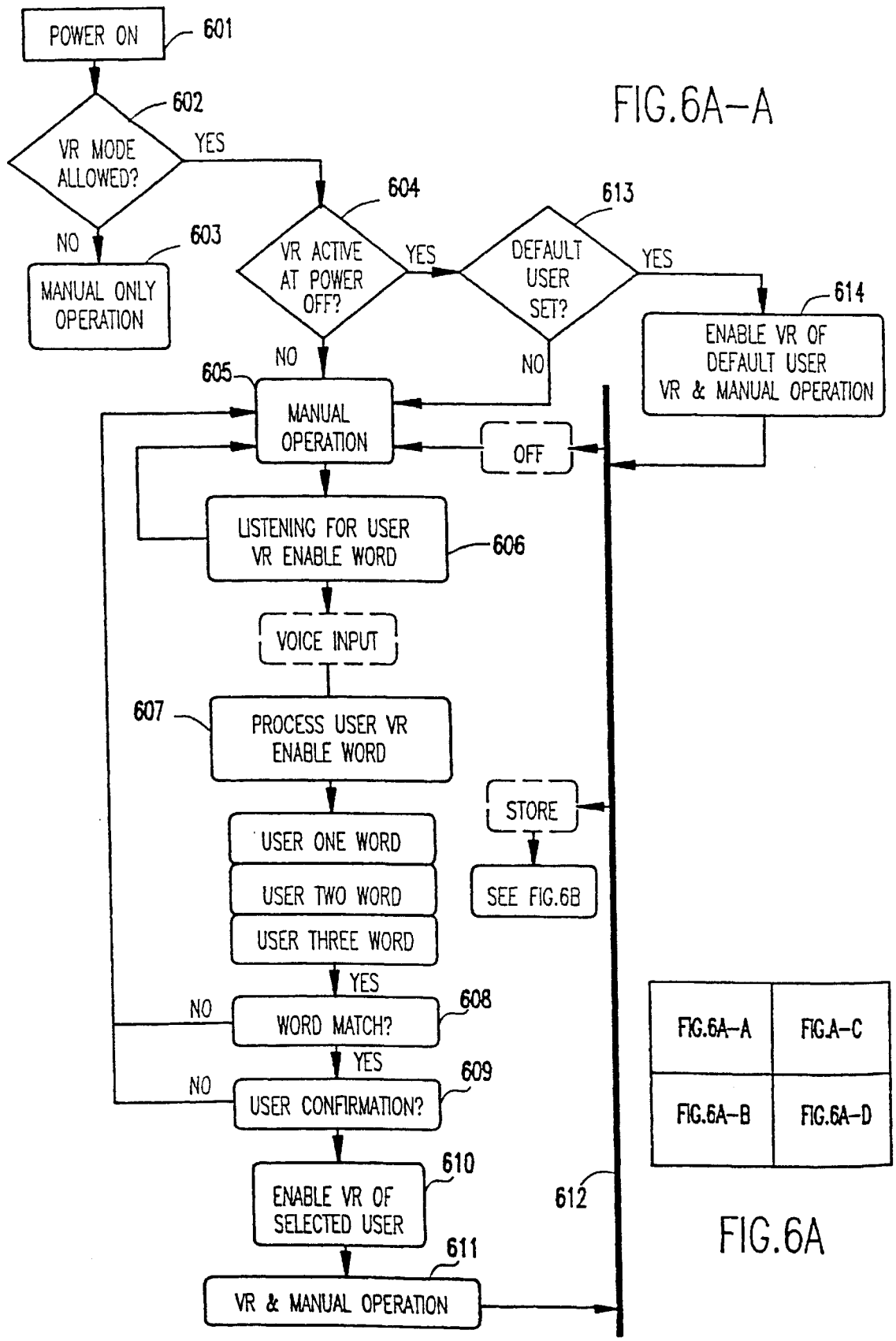

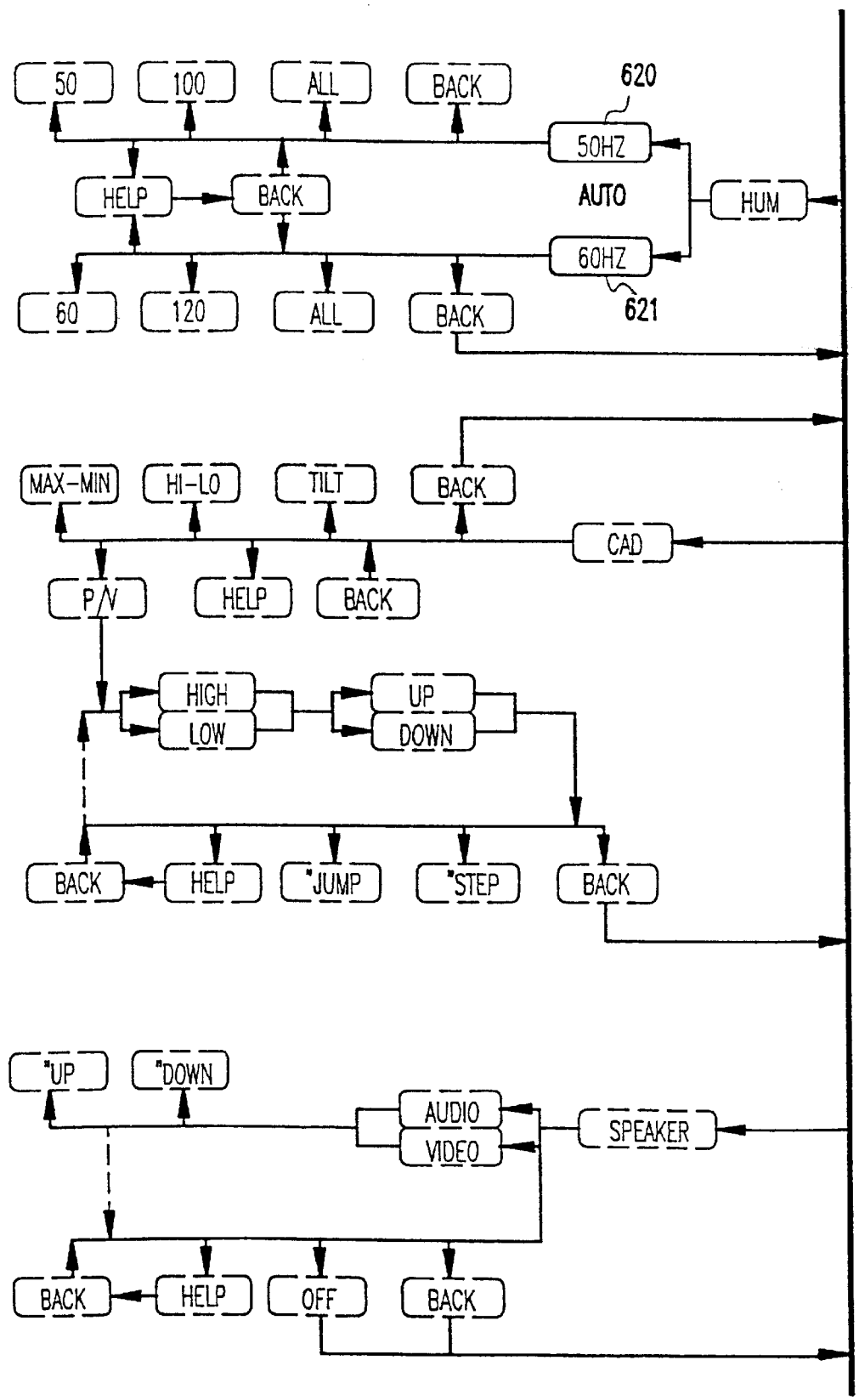
FIG.6A-B

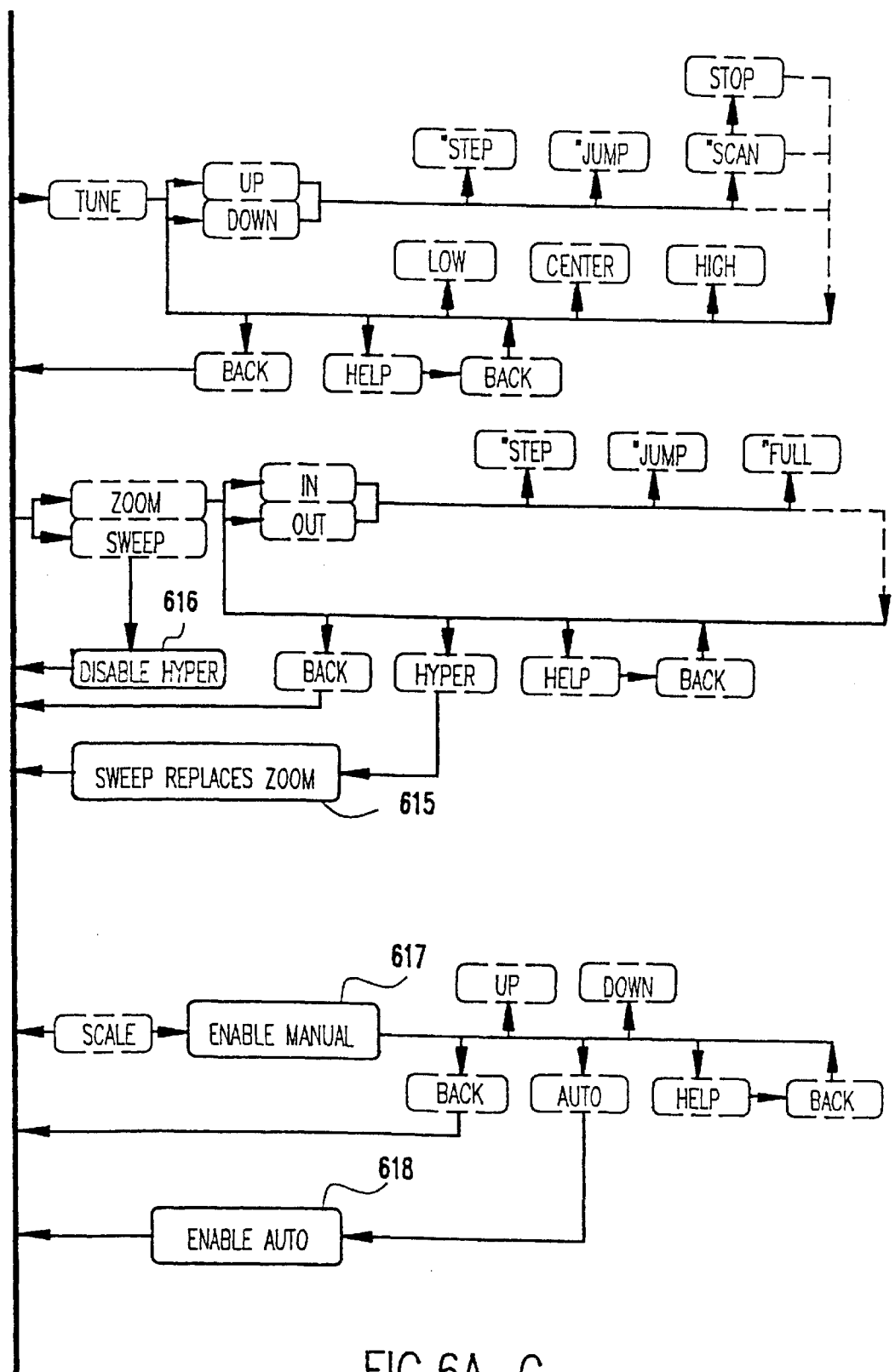
FIG.6A-C

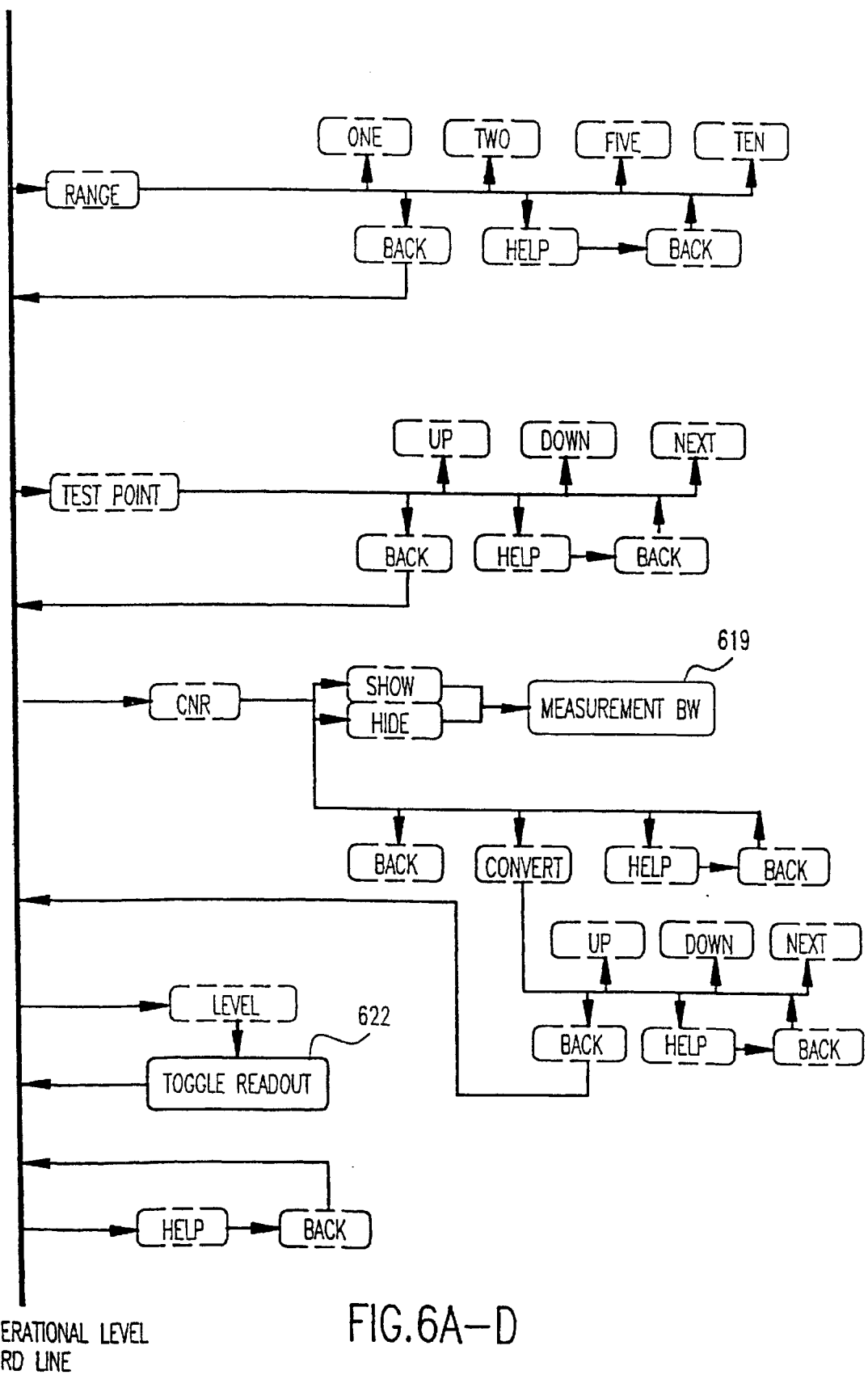
FIG.6A-D

HANDS-FREE SIGNAL LEVEL METER

BACKGROUND OF THE INVENTION

1. Field of the Invention

The present invention generally relates to electrical measurement equipment used to measure or monitor the characteristics of electrical signals and, more particularly, to electrical measurement equipment integrated as a body mounted or attachable display and voice recognition system for use in "hands free" measurement of electrical signals in a telecommunications system. The invention has particular application to radio frequency (RF) signal level meters used in the measurement of RF signals in a cable television plant but is equally applicable to other telecommunications measurement applications.

2. Background Description

Signal level meters for field use in cable television systems have been available in various forms for many years. However, state-of-the-art in signal level meters typically require the use of a display or meter movement, and the device is operated by some form of mechanical switching ; e.g., keyboards, buttons, knobs, or the like. Additionally, conventional devices are typically carried by hand and operated by hand. When used in adverse conditions, usually in aerial situations (e.g., poles, platforms, bucket truck, etc.), the user must use his or her hands to situate and operate the device while also protecting against an accidental fall.

SUMMARY OF THE INVENTION

It is therefore an object of the present invention to provide an electrical signal measurement device which can be worn by or attached to a technician so that the device can be operated in a "hands-free" manner.

According to one preferred embodiment of the invention, there is provided electrical measurement equipment integrated as a body mounted or attachable display and speech recognition system for use in "hands free" measurement of electrical signals in a telecommunications system. The electrical measurement equipment typically includes a system unit which is carried on or attached to the person of a technician by attachment to a belt, harness or the like and, in a first embodiment, a headpiece incorporating a display, microphone and head phone. The display, microphone and head phone are linked to the system unit and supported by software, including a speech recognition system, running on a central processing unit (CPU) which is part of the system unit.

In a second alternative embodiment, the headpiece is replaced with a chest mounted unit which folds down to provide convenient viewing of a display. In this embodiment, the microphone and a miniature speaker are integrated into a bezel surrounding the display. In both the first and second embodiments, a separate battery pack may be mounted like the system unit to a belt, harness or the like worn by the technician.

In a third embodiment, the three elements of the second embodiment, that is, the display, the system unit and the battery pack, are packaged in a compartmented fabric case which may be easily worn by a technician by means of a shoulder or neck strap.

In operation, the technician connects a probe to a test point in the cable or telecommunication system, and the technician operates the device by speaking into the microphone. The speech recognition system responds to the technician's spoken words to direct and navigate through a displayed user interface screen in order to operate the electrical signal measurement functions. Synthesized speech signals are generated to provide the user with audible feedback and messages. A signal introduced at the probe is sampled and digitized by the CPU and associated circuitry and then formatted for display by the display screen. The digitized signal is stored in memory, and may be later downloaded to a centralized data storage system for analysis.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
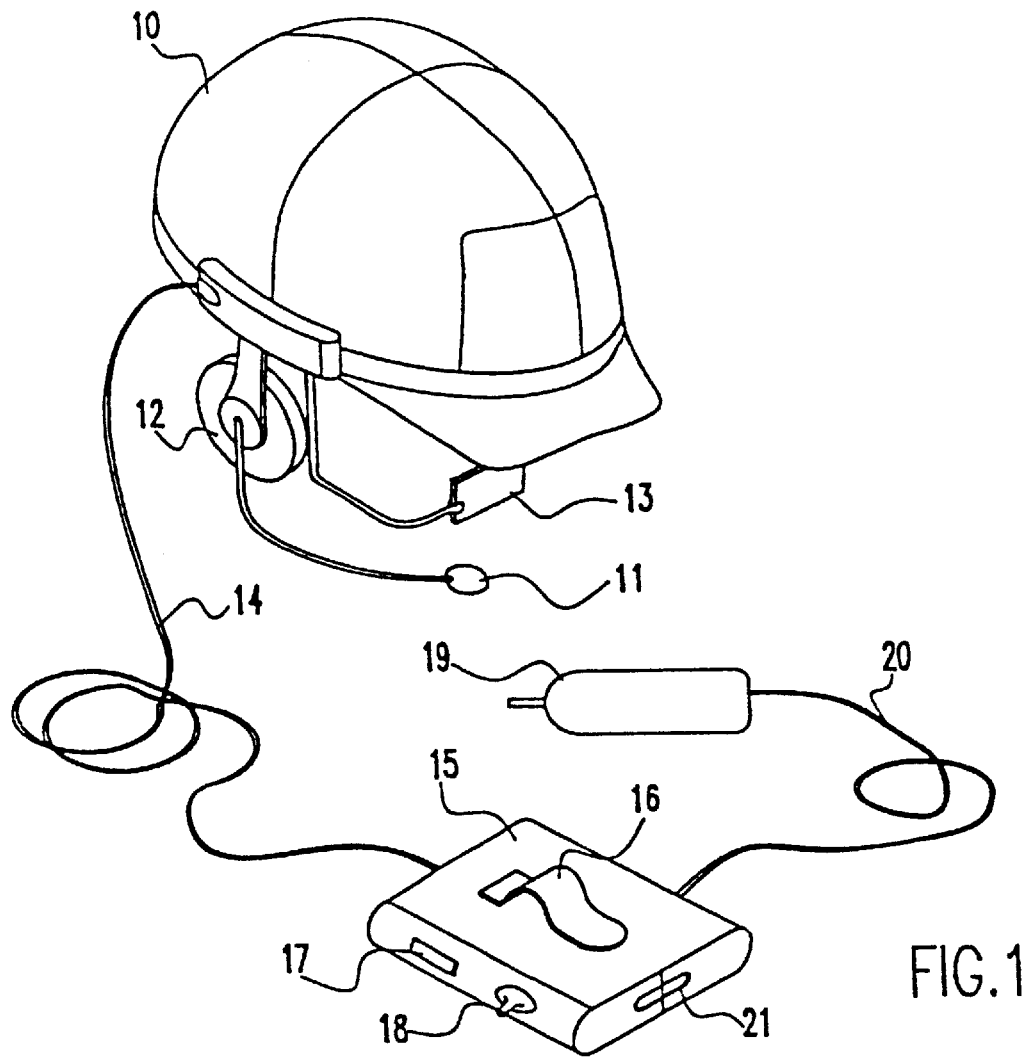
FIG. 1 is a pictorial view of a first embodiment of the invention comprising a hard hat worn by a technician and fitted with a display and microphone and connected by an electrical cable to a system unit for attachment to the technician's belt.

Referring now to the drawings, and more particularly to FIG. 1, there is shown a pictorial view of an implementation of a first preferred embodiment of the invention. A hard hat 10, of the type generally worn by technicians in the field, is fitted with a headset microphone 11 and head phone (or alternatively an earphone) 12 of conventional design. In addition, a display device 13 manufactured, for example, using liquid crystal display (LCD), phosphor on gate array or other suitable display technology is mounted to the hard hat 10. The technician looks at the display device 13 and sees an image of a computer display screen, shown in FIG. 7. The technician can activate various commands to perform a measurement by spoken words which are converted to electrical signals by the microphone 11 and transmitted by cable 14 to the system unit 15.

The system unit 15 is provided with a clip 16 for attachment to the technician's belt. Alternatively, a holster or pouch attached to the technician's belt can be used to secure the system unit 15. The system unit 15 includes a minimum of controls, typically an on/off power switch 17 and, optionally, a cursor control 18 for manually controlling a displayed pointing cursor which may be used as backup to the speech commands. A test probe 19 is connected to the system unit 15 by means of a cable 20. In addition, there is a serial connector 21 providing an interface to a desk top computer or other data collection system to allow down loading of data from the signal level meter to a central database and up loading of software upgrades. As described in more detail hereinafter, the system unit 15 includes a CPU and supporting chip set and other chips specific to the signal level meter speech recognition and synthesis functions. Power for the device may be a battery internal to the system unit 15, but in one modification, a separate battery unit (not shown) can be similarly provided for attachment to the technician's belt and connected to the system unit 15 by a power cable.

Figure 2:
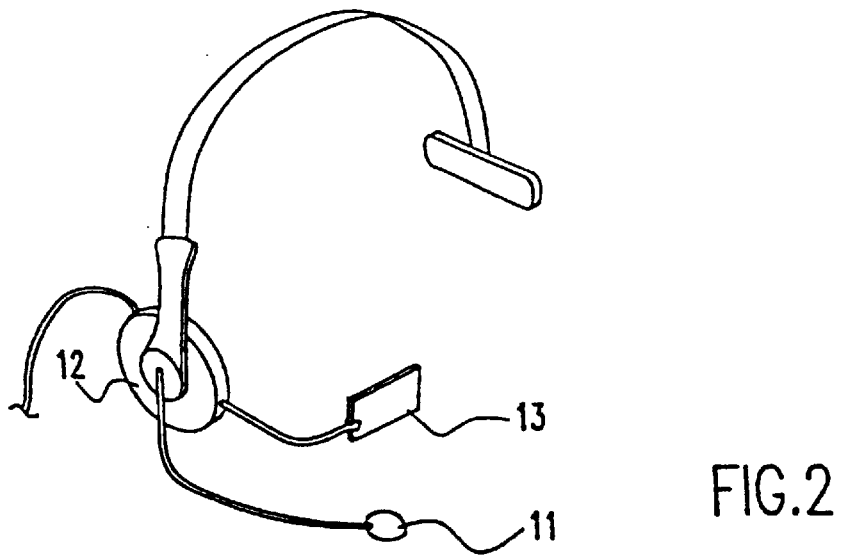
FIG. 2 is a pictorial view of a modification of the first embodiment of the invention showing an integrated head mounted piece.

FIG. 2 shows a further modification of the device shown in FIG. 1 in which the display 13, microphone 11 and ear phone 12 are integrated into a headpiece 21 rather than being attached to a hard hat. This modification would be used in those applications where hard hats are not required, such as in telecommunications closets or the like.

Figure 3A:
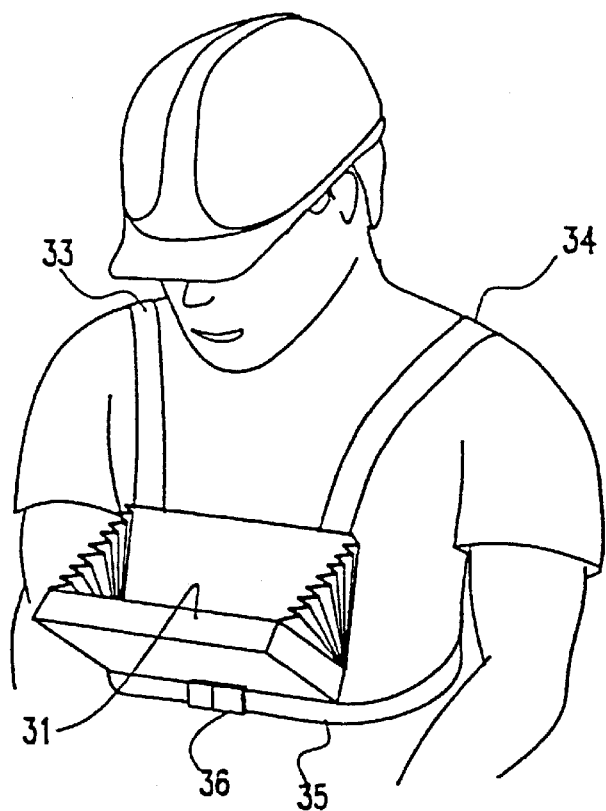
FIGS. 3A and 3B are pictorial views of a second embodiment of the invention comprising a chest mounted display.
Figure 3B:
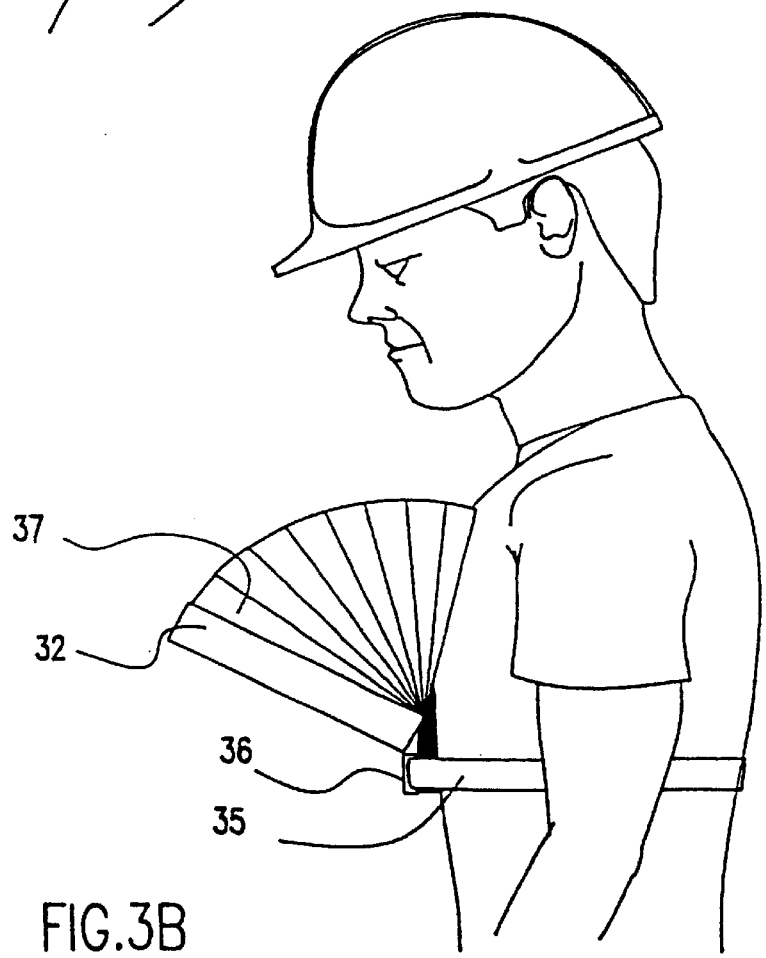

FIGS. 3A and 3B are pictorial views of a second embodiment of the invention showing a chest mounted display which uses the same system unit and battery pack (if a separate battery pack is used) as in the first embodiment. In this embodiment, the display 31 is held in a fabric case 32 attached to a harness worn by the technician. The harness comprises shoulder straps 33 and 34 and a belt strap 35. The case 32 is attached to the shoulder straps 33 and 34 by sewing, for example, and to one end of the belt strap 35, also by sewing, for example. The ends of the belt strap 35 are provided with buckle 36, allowing the technician to easily put on and remove the harness and display. The case 32 is provided with a fabric accordian 37 which allows the display 31 to be dropped to a comfortable viewing position. When not in use, the display is folded against the technician's chest and held by hook-and-loop fasteners (not shown) or similar such fasteners.

Figure 3C:
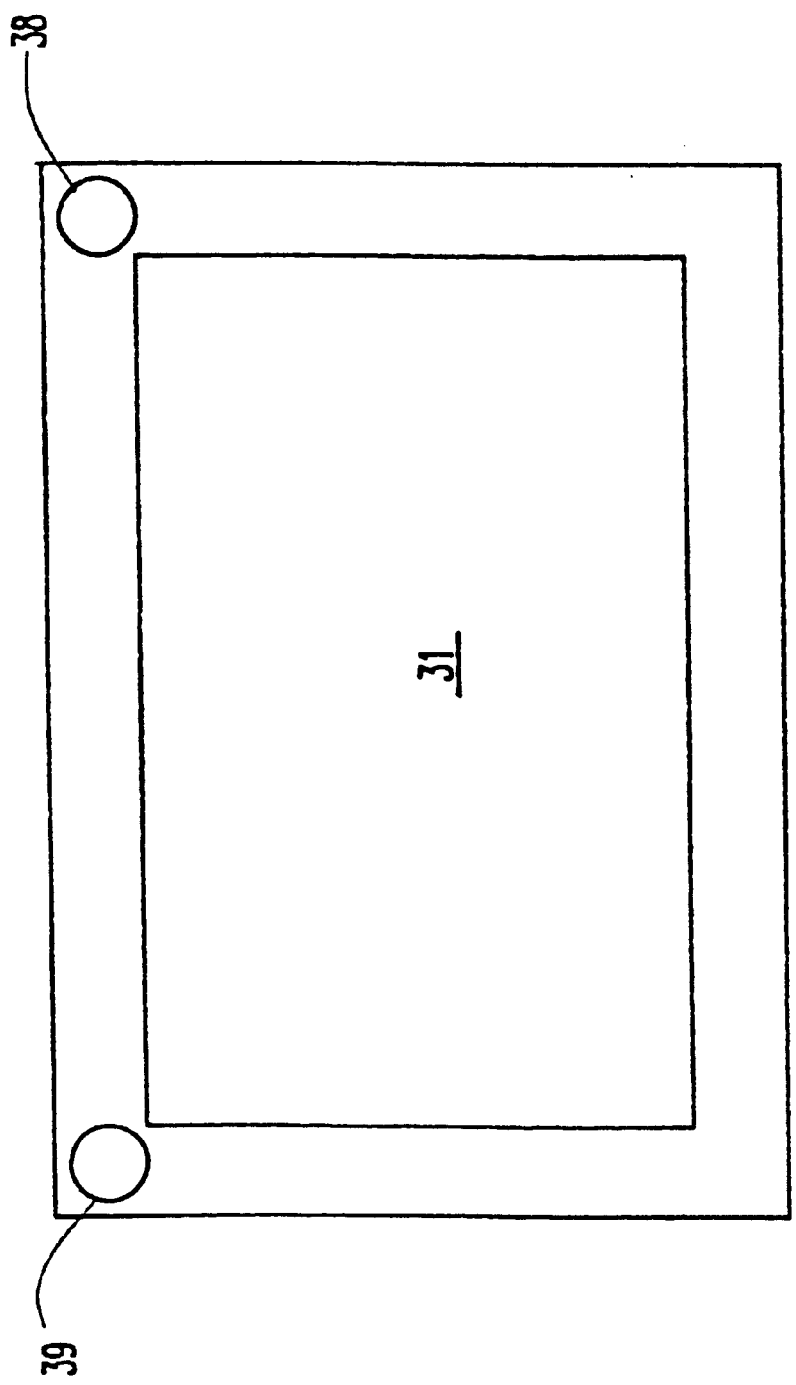
FIG. 3C is a plan view showing the display with an integrated microphone and miniature speaker.

FIG. 3C is a plan view of the display 31 showing a microphone 38 and miniature speaker 39 integrated into the bezel surround of the display.

Thus, the chest mounted display of this second embodiment provides the same functionality of the head mounted system of the first embodiment.

Figure 4A:
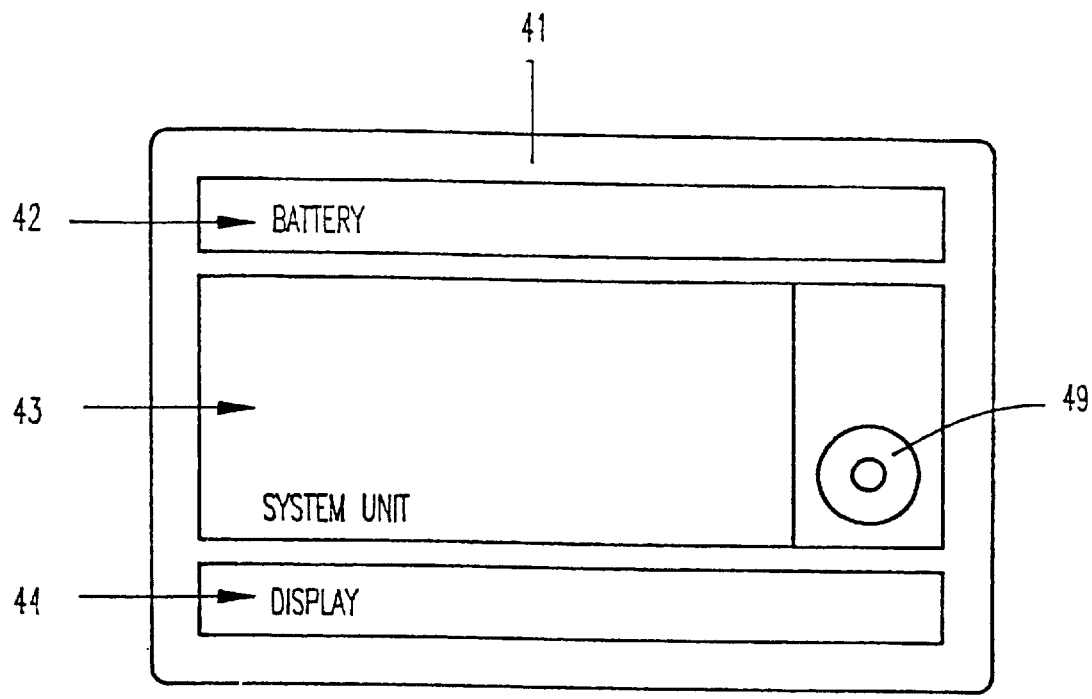
FIGS. 4A, 4B and 4C are, respectively, top, side and plan views of a third embodiment of the invention in which the three components of the second embodiment are packaged in a compartmented fabric case which may be easily worn by a technician.
Figure 4B:
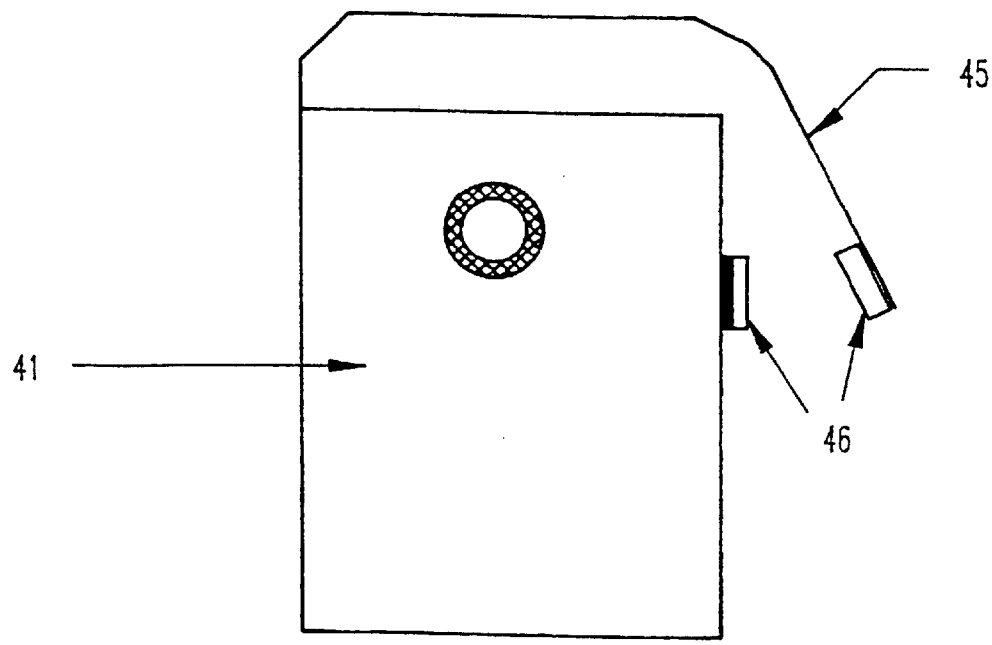
Figure 4C:
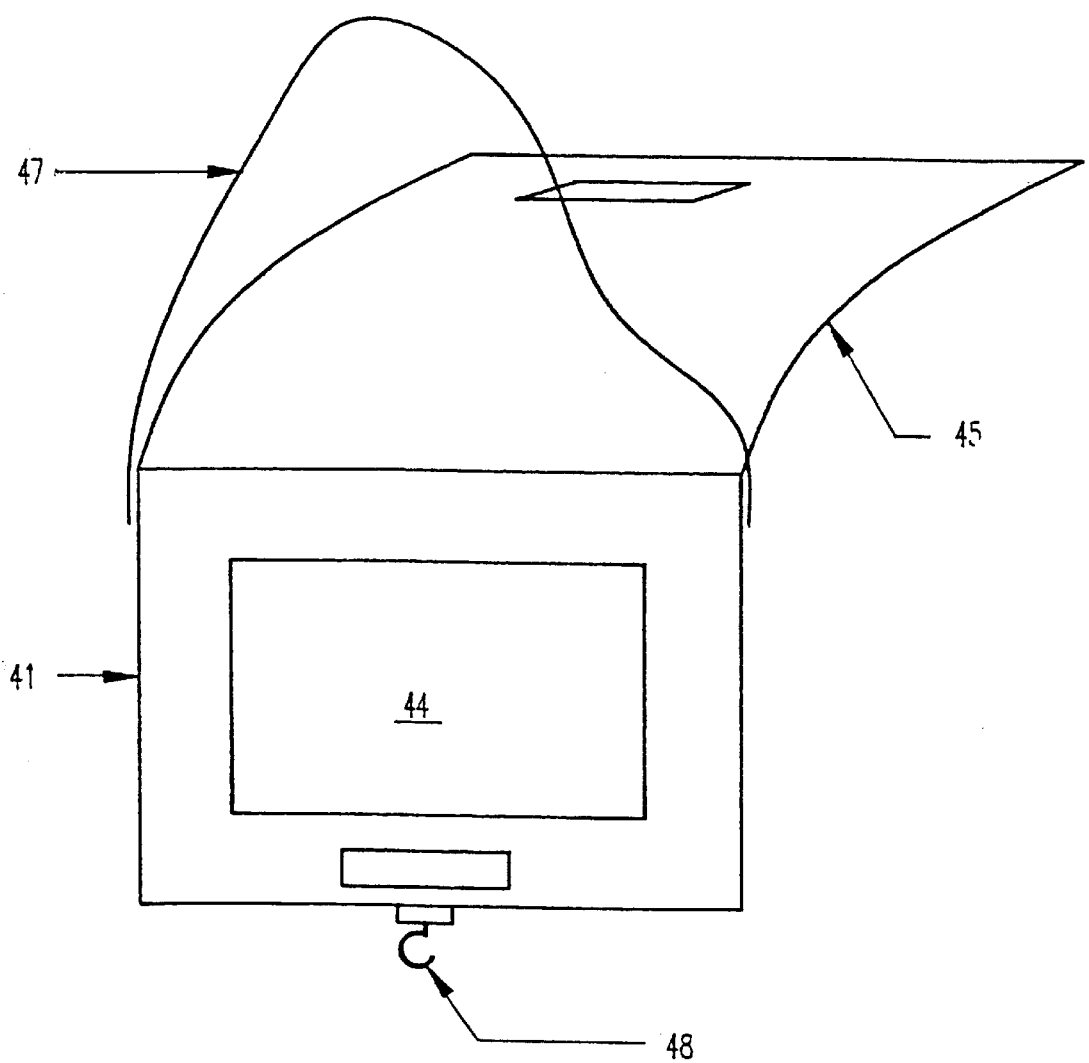

The components of the second embodiment may be conveniently packaged in a compartmented fabric case, as shown in FIGS. 4A, 4B and 4C. As shown in FIG. 4A, the case 41 is provided with three compartments, which receive respectively the battery pack 42, the system unit 43 and the display 44. The system unit compartment includes a sub-compartment to receive and store the probe 49 and its cord (not shown).

As shown in FIG. 4B, the case has a cover flap 45 which, when not in use, covers the display 44 and attaches to the case by means of a hook-and-loop fastener 46 or similar fastener. As shown in FIG. 4C, the case is provided with a shoulder or neck strap 47 which allows the technician to easily carry and, when making measurements, wear the device. In use, the technician simply places the strap 47 around his or her neck, allowing the device to hang freely down their front. A hook 48 at the bottom of the case 41 may be attached to the technician's belt or other harness and, by adjusting the length of the strap 47, a convenient viewing angle may be established. When the cover flap 45 is folded back, the display is revealed for viewing, as shown in FIG. 4C.

Figure 5:
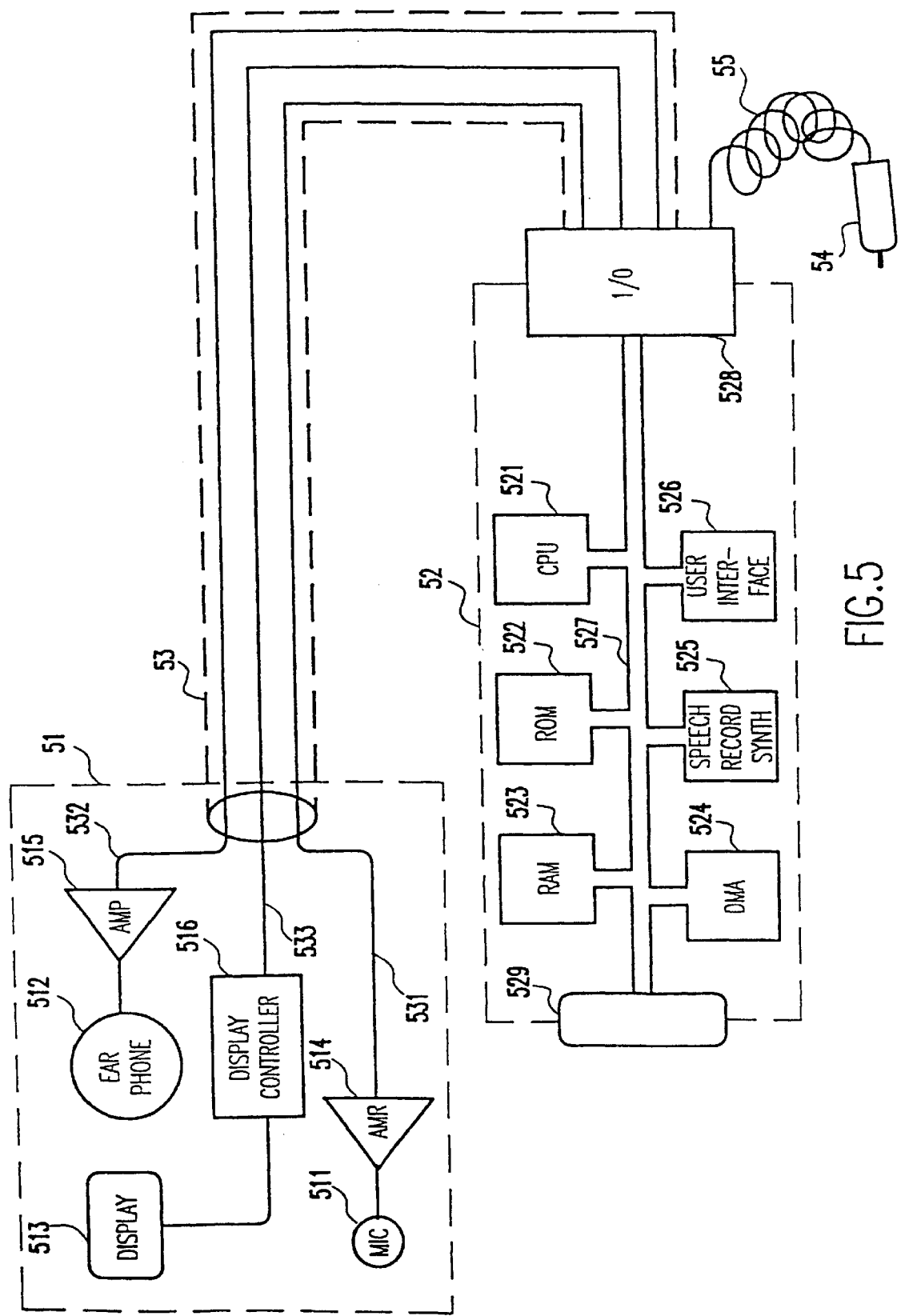
FIG. 5 is a block diagram of the circuitry for the hands free electrical signal measuring device according to the invention.

FIG. 5 is a block diagram of the circuitry of the electrical signal measuring device according to a preferred embodiment of the invention. The components which provide the direct user interface are shown in dotted line block 51, and the system unit mounted components are shown in dotted line block 52 with the two blocks interconnected by wires in cable 53, corresponding to cable 14 in FIG. 1, for example. The power for the components of both blocks 51 and 52 can be provided by a single battery (not shown) either in the system unit with power supplied over a wire in cable 53 or a separate battery pack connected to the system unit.

Within block 51 are the microphone 511, the ear phone 512 and the display device 513. The microphone 511 is connected to an amplifier 514 which amplifies the electrical signals generated by the microphone in response to spoken words of the technician. Amplifier 514 is connected by wire 531 to the system unit 52. The earphone 512 is connected to the system unit 52 via wire 532 and amplifier 515 which amplifies synthesized speech signals from the system unit. The display device 513 is connected to the system unit 52 via wire 533 and display controller 516 which drives the display device under the control of the CPU in the system unit.

Within in block 52 are the CPU 521, including a supporting chip set (not shown), read only memory (ROM) 522, random access memory (RAM) 523, direct memory access (DMA) controller 524, speech recognition and speech synthesis chip 525, and user interface 526, all connected to a system bus 527. Interface to the system bus 527 is by means of an input/output (I/O) controller 528 to which the wires in cable 53 are attached. Also attached to the system bus 527 via the I/O controller 528 is a test probe 54 and its connecting cable 55.

The user interface 526 receives signals from a cursor control device, corresponding to the cursor control 18 shown in FIG. 1, for example. A serial port 529 is also connected to the system bus 527. The ROM 522 may be, for example, a flash memory or programmable ROM (PROM, e.g., EPROM, E$^2$PROM, etc.) and contains the operating system and software interface to the application programs run on the CPU 521. The RAM 523 may be, for example, a static RAM (SRAM) or other non-volatile memory to retain measurement data for display and later downloading. Downloading is via serial port 529, and this port is also used to upload changes to the software as may be required from time to time.

It will be appreciated that the architecture of the system unit 52 is quite similar to that of a personal computer, either a desk top or a lap top personal computer. This allows the use of industry standard components and, therefore, economies of manufacture.

While it is known, for example, to provide attachments to lap top personal computers via the PCMCIA (Personal Computer Memory Card International Association) slot that implement digital multimeter and other functions, such a "hybrid" instrument is neither convenient to use nor well adapted to a specific application. In addition, the speech recognition and speech synthesis chip 525 is a component not normally included in such computers. An example of this chip is the Interactive Speech model RSC-164 general purpose microcontroller incorporating speech recognition and speech synthesis manufactured by Sensory, Inc., of Sunnyvale, Calif.

The on-chip speech recognition algorithms implemented in this chip reach an accuracy of greater than 96% for speaker-independent recognition and greater than 99% for speaker-dependent recognition. Speaker-independent recognition requires on-chip or off-chip ROM to store the words to be recognized. The RSC-164 chip has both continuous listening and consecutive entry modes of operation. Continuous listening allows the chip to continuously listen for a specific word. In this mode, the electrical signal measurement device "activates" when a specific word, preceded by quiet, is spoken. In continuous entry mode, the chip handles several speech inputs in succession as long as each input is surrounded by one-half second of quiet.

The electrical signal measuring device according to this invention is controlled by means of spoken words using speech recognition system software running on the CPU 521 supported by the speech recognition speech synthesis chip 525. The speech recognition and speech synthesis chip 525 used in the system unit according to a preferred embodiment of the invention support three speakers, with provision for adding an additional speaker after first deleting a current speaker. In use, there are a few speaker independent commands and several speaker dependent commands which are recognized by the speech recognition software. The software is activated by the speaker's speech and responds to the spoken words "one", "two" and "three" to activate the speaker dependent recognition routines for the first, second and third speakers, respectively. The actual spoken words, menu structure and training routines are custom written and compiled for the specific application. Additionally, user feedback/enunciation in the form of speech synthesis are provided by the speech recognition and speech synthesis chip 525.

The basic flow diagram for the speech recognition control is shown in FIG. 6A. In this diagram, the user's spoken words are shown in dotted line boxes and computer implemented software functions are shown in solid line boxes. The software implemented actions taken in response to spoken words are set out in tables below.

On power on in function block 601, a test is made in decision block 602 to determine if the speech recognition is allowed. If not, the system is enabled for manual operation only in function block 603. However, assuming that speech recognition is allowed, a further test is made in decision block 604 to determine if speech recognition was active at power off. If not, the system is enabled for manual operation in function block 605 and, in function block 606, the speaker independent speech command function is enabled. The system then awaits the detection of the user's speech.

When the user speaks, the system prompts the user in function block 607 to identify him or herself as one of a predetermined number of speakers this particular instrument will recognize. In a specific implementation, the speech recognition system has the capability to recognize the speech of three different users. These three users may identify themselves by, for example, speaking the words "one", "two" or "three". After prompting the user, the system then awaits identification of the user by the spoken words "one", "two" or "three". Once the user has identified him or herself, a test is made in decision block 608 to determine if there is a word match. If not, the process loops back to function block 605 where the system remains enabled in the manual operation mode. Assuming that this is a word match, a further test is made in decision block 609 to determine if there is user confirmation; that is, does the spoken word "one", "two" or "three" match the user speaking that word. If not, the process loops back to function block 605 where the system remains enabled in the manual operation mode. Assuming that there is user confirmation, the system enables the speech recognition routines for the selected user in function block 610. At this point, the speech recognition mode as well as the manual mode of operation is enabled for the selected user in function block 611, and the system enters the operational level word line generally denoted by the heavy line 612.

Returning to decision block 604, if speech recognition was active at power off, a further test is made in decision block 613 to determine if the system was set for a default user. If not, the process goes to function block 605 in order to identify the current user. If the system had been set for a default user, the speech recognition mode for the default user is enabled in function block 614, and the system enters the operational level word line 612, thus avoiding the need to identify the user with each power on.

As mentioned earlier, manual operation is basically a back up to the speech recognition mode of operation. Generally, manual operation is conventional using the cursor control 18 (FIG. 1) to move a displayed cursor and select a command or function by depressing the cursor control. In a specific implementation of the invention, there may be the same or more commands and functions which are selected manually as selected in speech recognition operation, but the important novel features of the invention are in the speech recognition mode of operation. Since the manual operation is conventional, no further description is necessary for those skilled in the art to practice that aspect of the invention.

Figure 6B:
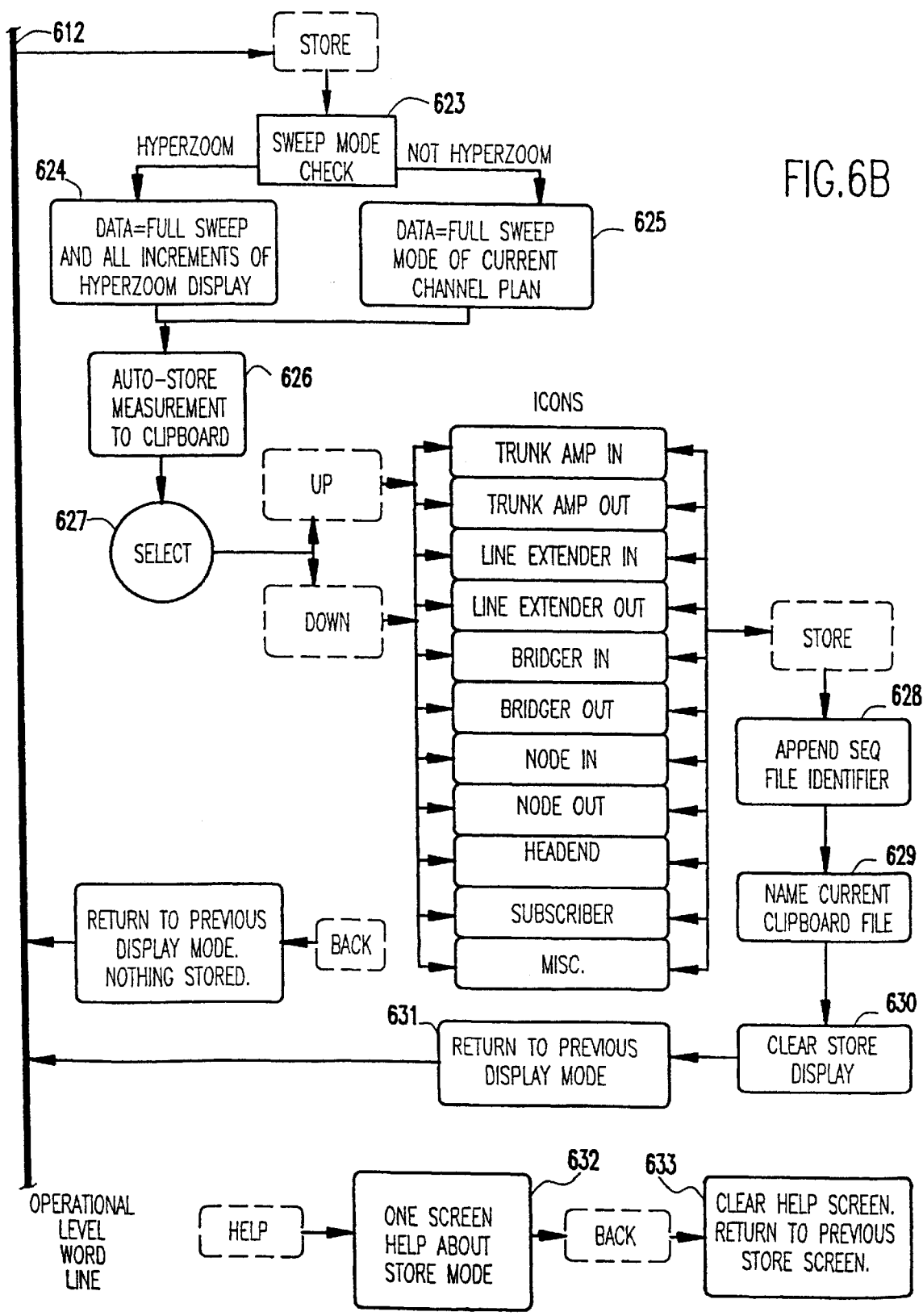
FIG. 6A is a block diagram showing the relationship of FIGS. 6A-A to 6A-D, and FIGS. 6A-A to 6A-D are flow diagrams of the speech recognition command control process implemented on the electrical signal measuring device of the invention.

There are several commands or functions controlled by speaker dependent commands. These are shown in FIG. 6A and in FIGS. 6B and 6C and set out in more detail in tabular form below. The first of these that will be discussed is the TUNE function which is activated by the spoken word "tune". As seen in Table 1 below and with reference to FIG. 6A, the tune command is laid out in a manner analogous to a pull down or fly out menu on a display screen, except that activation of the various functions and selections of operations in the "menu" is done by spoken command rather than selection by a pointing cursor controlled by the cursor control 18 (similarly to a mouse or track ball). It will be appreciated, however, that each of these commands can be selected using the pointing cursor.

In the command menu for the TUNE function as shown in FIG. 6A and Table 1, the system recognizes the spoken commands "up" and "down" to control the direction of cursor movement and increase or decrease the frequency being tuned. These spoken commands are augmented by the spoken commands "step", "jump" and "scan". The scan operation is stopped by the spoken word "stop". Other commands recognized are "low", "center" and "high" for cursor movement. There is also a "help" command that results in the display of a help screen about the TUNE function. Clearing of the help screen is accomplished by the spoken command "back". Note that a return to the top level word line 612 is made in response the spoken command "back".

TABLE 1

TUNE FUNCTION COMMANDS

| | |
|---|---|
| TUNE | Activate tune mode |
| LOW | Move cursor to first channel of channel plan, scroll if needed |
| CENTER | Move cursor to mid channel of channel plan, scroll if needed |

TABLE 1-continued

TUNE FUNCTION COMMANDS

| | |
|---|---|
| TUNE | Activate tune mode |
| HIGH | Move cursor to last channel of channel plan, scroll if needed |
| UP | Set direction of cursor movement, increase frequency |
| DOWN | Set direction of cursor movement, decrease frequency |
| JUMP | Move cursor in set direction by 10 channels, refresh |
| STEP | Move cursor in set direction by 1 channel, refresh |
| SCAN | Enable scan mode in set direction, scroll if needed |
| STOP | Disable scan mode, cursor at stop location |
| BACK | Deactivate tune mode |
| HELP | On screen help about tune mode, BACK to clear |

The next function is ZOOM. The spoken command hierarchy for this function is shown in FIG. 6A and set out in Table 2 below. The spoken commands recognized in support of this function include "in" and "out" for respectively expanding and compressing the direction of zoom. These commands are augmented by the commands "step", "jump" and "full". A further command, "hyper", causes the system to enter a sweep mode in function block 615 and, in response to the spoken command "sweep", the hyper mode is disabled and sweep is replaced by the zoom mode in function block 616. A "help" command results in the display of a help screen about the ZOOM function. Clearing of the help screen is accomplished by the spoken command "back". A return to the top level word line 612 is made in response the spoken command "back".

TABLE 2

ZOOM FUNCTION COMMANDS

| | |
|---|---|
| ZOOM | Active zoom mode |
| IN | Set direction of zoom, expand |
| OUT | Set direction of zoom, compress |
| FULL | Display max channels when "out", single channel when "in" |
| STEP | Zoom in/out by 1 zoom increment, refresh display |
| JUMP | Zoom in/out by 5 zoom increments, refresh display |
| HYPER | Enable hyper, return to top level, replace "zoom" with "sweep" |
| BACK | Deactivate zoom mode |
| HELP | On screen help about zoom mode, BACK to clear |
| SWEEP | Disable hyper mode, replace "sweep" with "zoom", return to top level |

The next function is SCALE as shown in FIG. 6A and in the following Table 3. The "manual" scale range is enabled by the spoken command "scale" in function block 617, and in this mode, the user may speak the words "up" and "down" to navigate the scale. In response to the spoken command "auto", the manual scale range is deactivated in function block 618. A "help" command results in the display of a help screen about the SCALE function. Clearing of the help screen is accomplished by the spoken command "back". A return to the top level word line 612 is made in response the spoken command "back".

TABLE 3

SCALE FUNCTION COMMANDS

| | |
|---|---|
| SCALE | Activate manual scale mode |
| UP | Increment amplitude display up 1 division, refresh display |
| DOWN | Increment amplitude display down 1 division, refresh display |
| AUTO | Deactivate manual range, activate auto range, return to top level |
| BACK | Hold manual setting, deactivate range mode, return to top level |
| HELP | On screen help about range mode, BACK to clear |

The next function is RANGE as shown in FIG. 6A and in the following Table 4. The system responds to spoken range increments of "one", "two", "five", and "ten". A "help" command results in the display of a help screen about the RANGE function. Clearing of the help screen is accomplished by the spoken command "back". Again, a return to the top level word line 612 is made in response to the spoken command "back".

TABLE 4

RANGE FUNCTION COMMANDS

| | |
|---|---|
| RANGE | Activate range mode |
| ONE | Set amplitude scale to 1 dB/div, refresh display |
| TWO | Set amplitude scale to 2 dB/div, refresh display |
| FIVE | Set amplitude scale to 5 dB/div, refresh display |
| TEN | Set amplitude scale to 10 dB/div, refresh display |
| BACK | Hold scale setting, deactivate scale mode, return to top level |
| HELP | On screen help about scale mode, BACK to clear |

The next function is TEST POINT as shown in FIG. 6A and in the following Table 5. The system responds to spoken navigation commands of "up", "down" and "next". A "help" command results in the display of a help screen about the TEST POINT function. Clearing of the help screen is accomplished by the spoken command "back". Again, a return to the top level word line 612 is made in response the spoken command "back".

TABLE 5

TEST POINT FUNCTION COMMANDS

| | |
|---|---|
| TEST POINT | Active test point mode |
| UP | Increment selected digit up |
| DOWN | Increment selected digit down |
| NEXT | Select next digit to right, wrap around |
| BACK | Set test point offset, deactivate test point mode, return to top level |
| HELP | On screen help about test point mode, BACK to clear |

The next function is the comparative analysis display or CAD as shown in FIG. 6A and the following Table 6. The system then responds to spoken commands of "tilt", "hi-lo", and "max-min". Again, a return to the top level word line is made in response the spoken command "back". The spoken command "PV" branches to allow further navigation, in which case the system responds to the spoken commands of "high", "low", "up", "down", "jump", and "step". A "help" command, which can be invoked in either branch, results in the display of a help screen about the CAD function.

Clearing of the help screen is accomplished by the spoken command "back" and, again, the spoken command "back" to return to the top level word line 612.

TABLE 6

CAD FUNCTION COMMANDS

| | |
|---|---|
| CAD | Activate comparative analysis display mode |
| HI-LO | Enable hi-lo display, disable tilt, max-min, p/v |
| TILT | Enable tilt display, disable hi-lo, max-min, p/v |
| MAX-MIN | Enable max-min display, disable tilt, hi-lo, p/v |
| P/V | Enable p/v display, disable tilt, hi-lo, max-min |
| HIGH | Select upper horizontal cursor |
| LOW | Select lower horizontal cursor |
| UP | Set direction of selected cursor to up |
| DOWN | Set direction of selected cursor to down |
| STEP | Move selected cursor in set direction by 1 pixel |
| JUMP | Move selected cursor in set direction by 10 pixels |

TABLE 6-continued

CAD FUNCTION COMMANDS

| | |
|---|---|
| CAD | Activate comparative analysis display mode |
| BACK | Hold cursor positions, disable control, return to top level |
| HELP | On screen help about p/v mode, BACK to clear |
| BACK | Return to top level, selected mode enabled |
| HELP | On screen help about cad mode, BACK to clear |

The next function is CNR (Carrier to Noise Ratio) as shown in FIG. 6A and in the following Table 7. The system then responds to the commands "show" and "hide", and in response to the spoken commands "show" and "hide", a bandwidth measurement is made in function block 619. A "help" command results in the display of a help screen about the CNR function. Clearing of the help screen is accomplished by the spoken command "back". Again, a return to the top level word line 612 is made in response the spoken command "back". Alternatively, branch is made in response to the spoken word "convert", in which case the system responds to the spoken words "up", "down" and "next" to navigate and, as in the first branch, a "help" command results in the display of a help screen about the CNR function. Clearing of the help screen is accomplished by the spoken command "back". To return to the top level word line 612, the user speaks the command "back".

TABLE 7

CNR FUNCTION COMMANDS

| | |
|---|---|
| CNR | Activate CNR mode, initiate measurement |
| SHOW | Enable display of bandwidth used in measurement |
| HIDE | Disable display of bandwidth used in measurement |
| CONVERT | Activate convert function |
| UP | Increment selected digit up, update converted figure |
| DOWN | Increment selected digit down, update converted figure |
| NEXT | Select next digit to right, wrap around |
| BACK | Deactivate convert function, return to top level |
| HELP | On screen help about convert function, BACK to clear |
| BACK | Deactivate cnr mode, return to top level |
| HELP | On screen help about cnr mode, BACK to clear |

The next function is HUM as shown in FIG. 6A and in the following Table 8. In response to the spoken command "hum", the system automatically switches between 50 Hz mode in function block 620 or 60 Hz mode in function block 621, depending on the detected power line frequency. In either mode, the system responds to the spoken commands of "50" (or "60"), "100" (or "120") and "all". A "help" command results in the display of a help screen about the HUM function. Clearing of the help screen is accomplished by the spoken command "back". Again, a return to the top level word line 612 is made in response the spoken command "back".

TABLE 8

HUM FUNCTION COMMANDS

| | |
|---|---|
| HUM | Activate hum mode, initiate measurement |
| 50 | Enable 50 Hz measurement (if sync is 50 Hz) disable 100, all |
| 100 | Enable 100 Hz measurement (if sync is 50 Hz) disable 50, all |
| 60 | Enable 60 Hz measurement (if sync is 60 Hz) disable 120, all |
| 120 | Enable 120 Hz measurement (if sync is 60 Hz) disable 60, all |
| ALL | Enable all frequency measurement, disable 50/100, 60/120 |

TABLE 8-continued

HUM FUNCTION COMMANDS

| | |
|---|---|
| HUM | Activate hum mode, initiate measurement |
| BACK | Enable all frequency, deactivate hum mode, return to top level |
| HELP | On screen help about hum mode, BACK to clear |

The next function is SPEAKER as shown in FIG. 6A and in the following Table 9. The system then responds to the commands to select either "audio" or "video", and thereafter to the commands "up" and "down" to navigate and to "off" to deactivate speaker mode and enable sweep before returning to top level word line. A "help" command results in the display of a help screen about the SPEAKER function. Clearing of the help screen is accomplished by the spoken command "back". Again, a return to the top level word line is made in response the spoken command "back".

TABLE 9

SPEAKER FUNCTION COMMANDS

| | |
|---|---|
| SPEAKER | Activate speaker mode, disable sweep, loudness at 2 (1–15) |
| AUDIO | Select TV audio carrier, not available on digi, data, or fm |
| VIDEO | Select TV video carrier, not available on digi, data, or fm |
| UP | Increase loudness 1 increment |
| DOWN | Decrease loudness 1 increment |
| OFF | Deactivate speaker mode, enable sweep, return to top level |
| BACK | Speaker mode active, disable sweep, return to top level |
| HELP | On screen help about speaker mode, BACK to clear |

There are three other functions shown in FIG. 6A to which the speech recognition system responds from the top level word line 612. These functions are invoked by the spoken commands "level", "help" and "store". In response to the spoken command "level", a readout is toggled in function block 622, and a return is made to the operational level word line 612. The "help" command results in the display of a help screen about the operational level; that is, a description of the various functions which may be accessed from the operational level word line 612. Clearing of the help screen is accomplished by the spoken command "back".

The other function invoked by a spoken command is the STORE function, which is illustrated in FIG. 6B and summarized in Table 10 below. This command is used for storing measured data which can later be downloaded to a central data storage for analysis. In response to the "store" command, the system first checks the sweep mode in function block 623 to determine if in the hyperzoom mode. If so, the data to be stored is the full sweep and all increments of the. hyperzoom display in block 624; otherwise, the data to be stored is the full sweep mode of the current channel plan in block 625. In either case, the system then enters the auto-store measurement to the clipboard in function block 626. Next, the system prompts the user to select from several displayed icons a name for the measurement to be stored. The user navigates among the several icons with the spoken commands "up" and "down". When the desired icon is highlighted, the user then speaks the command "store" again and, in response, the system appends a sequence file identifier to the measured data in function block 627 and names the current clipboard file in function block 628 according to the selected icon. Then, the system clears the store display in function block 629 and returns to the previous display mode in function block 630. If during the store command routine and before speaking the command "store" for the second time the user were to decide not to store the data in the current clipboard file, the user need only to speak the command "back" and a return is made in function block 631 to the previous display mode. The "help" command is available from any point in the store mode and results in the display of a help screen 632 about the STORE function. Clearing of the help screen in function block 633 is accomplished by the spoken command "back".

TABLE 10

STORE FUNCTION COMMANDS

| | |
|---|---|
| STORE | Activate store mode |
| UP | Increment file type selection up one line in list |
| DOWN | Decrement file type selection down one line in list |
| STORE | Store data as selected file type with auto extension, return to main display |
| BACK | Exit store mode, no data saved |
| HELP | On screen help about store mode, BACK to clear |

Speech synthesized responses/messages from the system to the user include the following:
  PLEASE SPEAK LOUDER (below speech recognition threshold)
  PLEASE REPEAT (confidence level below a predetermined level)
  PLEASE MAKE SELECTION (when a selection is needed to continue)
  PLEASE VERIFY USER (after a predetermined number of recognition errors)
  WARNING, LOW BATTERY
  WARNING, DISPLAY TIME OUT (power management active)
  WARNING, POWER SHUT DOWN IN ONE MINUTE (power management active)
  WELCOME (power on message)
  CALIBRATION NOW DUE (on power up after recalibration date)
  FREE MEMORY IS LOW (during file operations)
These messages are synthesized by the speech recognition and speech synthesis chip 525 under the control of the CPU 521 shown in FIG. 5. These messages are transmitted to the head phone 512 (or speaker).

Figure 7:
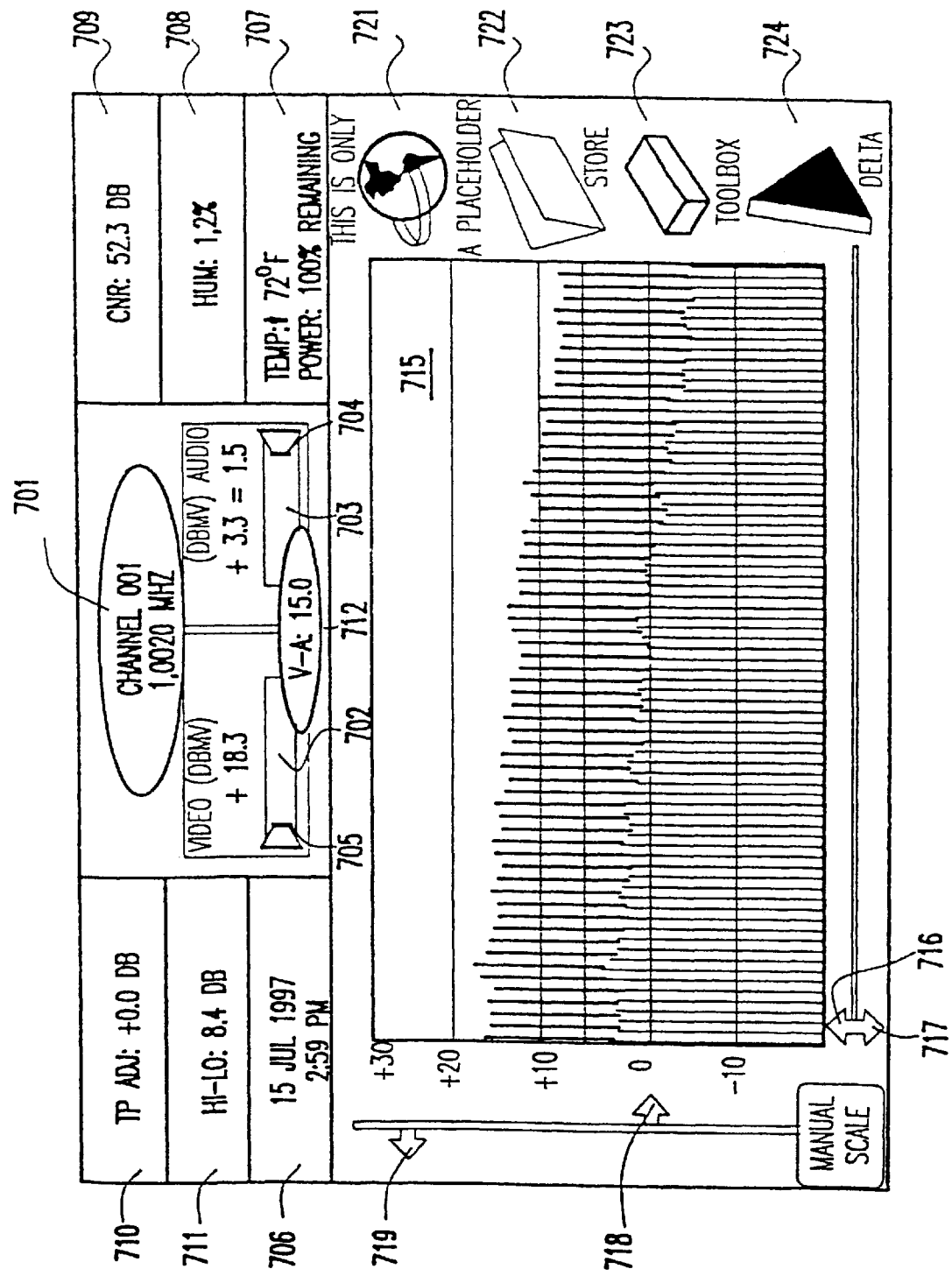
FIG. 7 is an illustration of the main measurement screen displayed in the operation of the preferred embodiment of the invention.

A key feature of the invention is the display screen displayed to the technician on the display device 513. This screen use a graphical user interface (GUI) which, under speech command, allows the user to navigate and select functions. In addition, digitized signal measurements are displayed in a window on the display screen for viewing by the technician. Each startup operation results in an optional "Welcome" screen (not shown). This is followed by a single measurement screen, an example of which is shown in FIG. 7. This screen is specifically designed for use in a signal level meter for measurement of RF signals in a cable television plant.

At the top of the screen shown in FIG. 7 is a header comprising several display/activator buttons. In the top center of this screen, a select channel/frequency display/activator button 701 is displayed. This displays, and allows the selection of, the channel number or frequency. The channel number is displayed as an alpha numeric indicia, while the frequency is displayed as a numeric indicia.

Figure 8A:
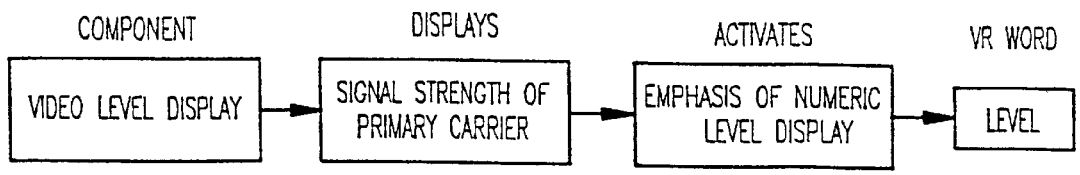
FIGS. 8A to 8P show the relationships of the various icons, activities, displays and spoken commands of the main measurement screen of FIG. 7.

Below and to the left of display/activator button 701 is a video display/activator button 702 which displays video level of the selected channel/frequency. This is a screen component with both activator and speech recognition functions. FIG. 8A shows the relation of the video level display and the spoken command word "level".

Figure 8B:
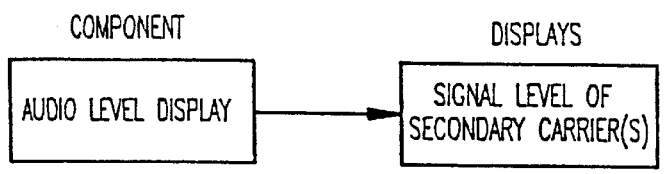

Below and to the right of the display/activator button 701 is an audio level display/activator button 703 which displays the audio level of the selected channel/frequency. This is a screen component with display only function. FIG. 8B shows the audio level display and its content.

Figure 8C:

The right audio speaker icon 704 provides activation of frequency modulated (FM) detected primary audio of the selected channel/frequency through the speaker. This is a screen component with both activator and speech recognition functions. FIG. 8C shows the relation of the right audio horn icon and the spoken command word "speaker".

Figure 8D:
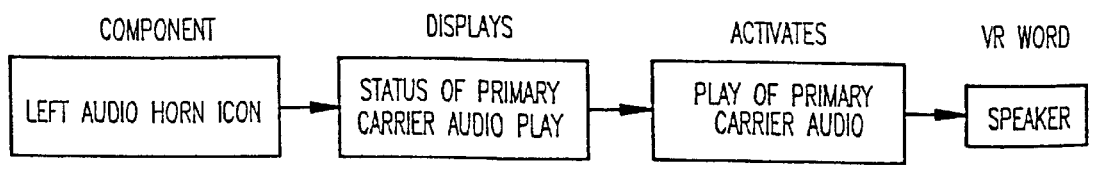

The left audio speaker icon 705 provides activation for a secondary carrier (i.e., synch buzz, dig noise). This is a screen component with both activator and speech recognition functions. FIG. 8D shows the relation of the left audio horn icon and the spoken command word "speaker".

Figure 8E:
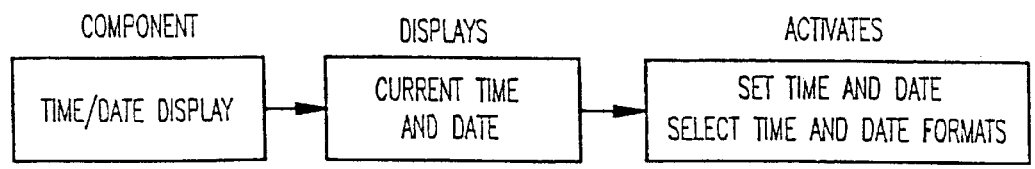

To the left of the left audio speaker icon 705 is a time and date display/activator button 706. This display/activator button displays and allows adjustment of the time and date. This is a screen component with an activator function but no speech recognition function. FIG. 8E shows the relation of the time and date activator button to its function.

Figure 8F:
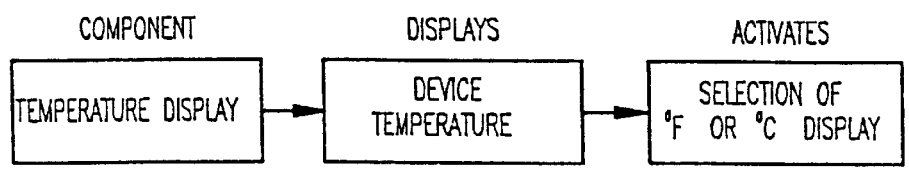

Opposite the time and date activator button 706, and to the right of the right audio speaker icon 705, is a temperature display/activator button 707 which also incorporates an indication of the power remaining, i.e., battery level. This display/activator button displays temperature (default is degrees Fahrenheit) and allows adjustment of the temperature unit of measure. This again is a screen component with an activator function but no speech recognition function. FIG. 8F shows the relation of the temperature activator button to its function. In addition, the display/activator button 707 displays power remaining as a percentage of a full battery charge.

Figure 8G:
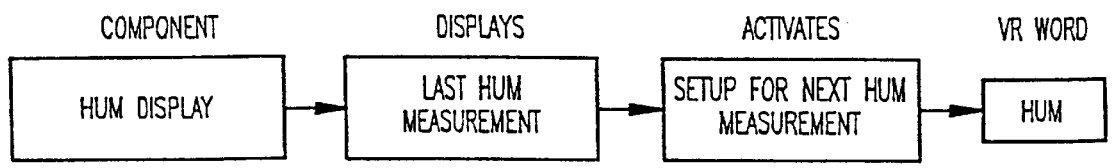

Just above the temperature display/activator button 707 is a HUM display/activator button 708 which displays the calculated HUM measurement. This is a screen component with both activator and speech recognition functions. FIG. 8G shows the relation of the hum display and the spoken command word "hum".

Figure 8H:
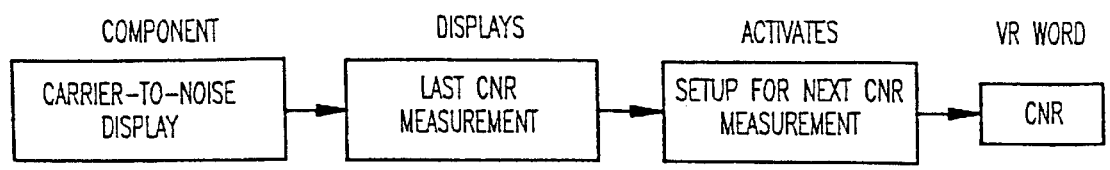

Just above the hum button 708 is a Carrier to Noise Ratio (CNR) display/activator button 709 which displays the current measurement value. Again, this is a screen component with both activator and speech recognition functions. FIG. 8H shows the relation of the carrier to noise ration display and the spoken command word "CNR".

Figure 8I:
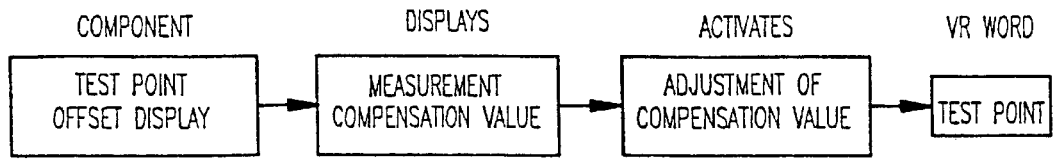

Opposite the CNR button 709, on the left side of the display is a Test Point (TP) offset display/activator button 710 which displays a measurement compensation value. This is a screen component with both activator and speech recognition functions. FIG. 8I shows the relation of the test point offset display and the spoken command word "test point".

Just below the test point button 710 is a comparative analysis display/activator (CAD) button 711 which displays the following measurements:
  (a) HI-LO—the level difference between the high "pilot" carrier and the low "pilot" carrier.
  (b) TILT—a graphic representation of the level difference between the high "pilot" carrier and the low "pilot" carrier.
  (c) P/V (Peak to Valley)—the difference between the highest carrier and the lowest carrier.
  (d) MAX-MIN—the difference between the highest level carrier and the lowest level carrier.

Figure 8J:
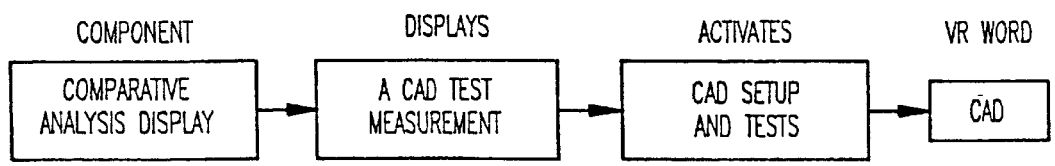

This also is a screen component with both activator and speech recognition functions. FIG. 8J shows the relation of the comparative analysis display and the spoken command word "CAD".

Figure 8K:
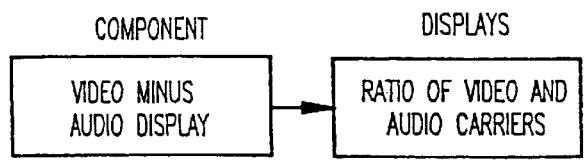

Completing this header display is a video minus audio (V-A) display 712. This is a screen component with a display only function. FIG. 8K shows the content of the display.

Figure 8L:
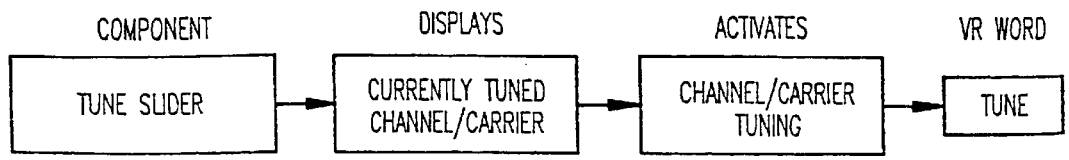

Referring back to FIG. 7, the main measurement display 715 provides a graphic interpretation of the measurement spectrum, in this case a sampled spectrum as described in more detail in U.S. Pat. No. 4,685,065 to Warren Braun et al. and assigned to the assignee of this application. Below the main measurement display window 715 are a tune slider 716 and a zoom slider 717. These are both screen components with activator and speech recognition functions. FIGS. 8K and 8L respectively show the relation of the tune slider and the zoom slider and the spoken command words "tune" and "zoom".

Figure 8M:
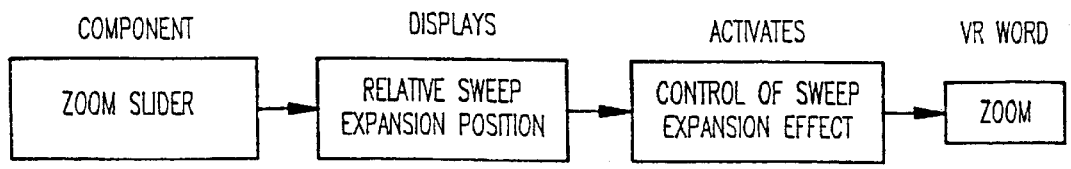
Figure 8N:
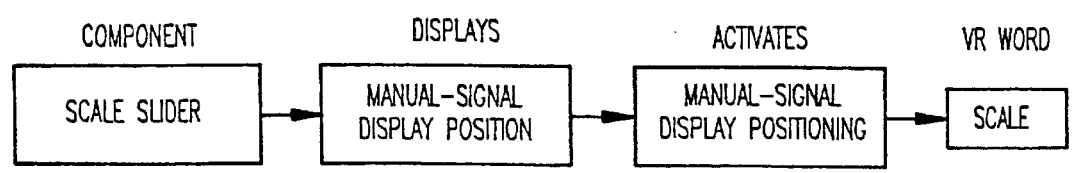

To the left of the main measurement display window 715 are a scaling slider 718 and a range slider 719. These are both screen components with activator and speech recognition functions. FIGS. 8M and 8N respectively show the relation of the scale slider and the range slider and the spoken command words "scale" and "range".

Figure 8O:
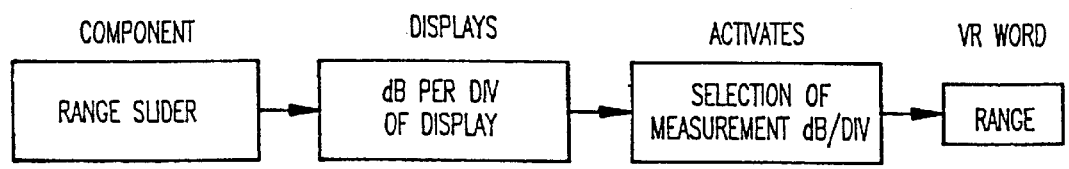

To the right of the main measurement display window 715 are several icons. The first of these is a logo icon 721 which incorporates a facsimile of a globe which is displayed as spinning with the unit is powered on and serves as a gateway to (a) user help, (b) user manual, (c) guided tour, (d) cable calculator, and (d) "get info". This is a screen component with only an activator function. FIG. 8O shows the relation of the logo icon to the activities which can be accessed.

Figure 8P:
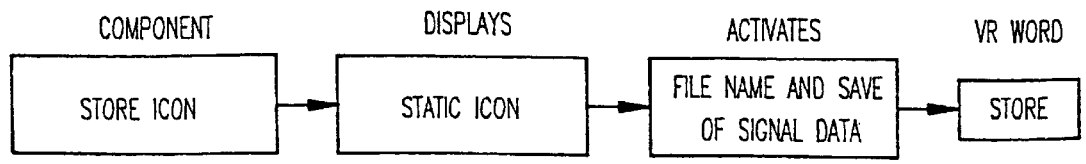

Next is the store icon 722 which serves as a gateway to the store measurement function. This is a screen component with activator and speech recognition functions. FIG. 8P shows the relation of the store icon the spoken command word "store".

Below the store icon is the toolbox icon 723 and, finally, the delta icon 724. These are both screen components with only activator function. The toolbox icon provides access to configuration, file manager and display functions. The delta icon provides access to a delta measurement function.

While the invention has been described in terms of a single preferred embodiment, those skilled in the art will recognize that the invention can be practiced with modification within the spirit and scope of the appended claims. Specifically, the preferred embodiment has been described in terms of a specific implementation designed for cable television RF measurements. However, there are many other measurements of electrical signals which must be routinely made in the telecommunications industry that would benefit from the hands-free speech recognition operation provided by the general principles of the invention.

Having thus described our invention, what we claim as new and desire to secure by Letters Patent is as follows:

1. A self-contained hands free electrical signal measurement device comprising:

a system unit which is attachable to or worn on the person of a technician, the system unit including a central processing unit (CPU) and associated circuitry running speech recognition software, a speech recognizer communicating with the CPU to operate electrical signal measurement functions in response to spoken commands, a memory communicating with the CPU to store digitized measurments, and a port to allow downloding of digitized measurements stored in the memory for the purpose of further analysis at a remote location;

a test probe connected to said system unit and connectable to an electrical test point for making an electrical signal measurement, the CPU digitizing a measured electrical signal and formatting the digitized signal for display and storing in the memory; and an integrated visual display and an audio link to the system unit, the audio link generating electrical signals in response to spoken commands by the technician, which spoken commands are recognized by the speech recognition software running on the CPU and associated circuitry to direct and navigate through a displayed user interface in order to operate electrical signal measurement device functions, including storing digitized measurements in memory, and the CPU providing user feedback and messages, whereby all measurements may be made in a hands free manner.

2. The self-contained hands free electrical signal measurement device recited in claim 1 further comprising a user interface to receive manual controls entered by a user to direct and navigate through a displayed user interface in order to operate electrical signal measurement device functions.

3. The hands free self-contained electrical signal measurement device recited in claim 2 further comprising a cursor control on said system unit and wherein the user interface is responsive to the cursor control.

4. The self-contained hands free electrical signal measurement device recited in claim 1 wherein the integrated visual display and audio link comprise a headpiece incorporating the visual display, a microphone and a head phone.

5. The self-contained hands free electrical signal measurement device recited in claim 1 wherein the integrated visual display and audio link comprise the visual display, a microphone and head phone attached to a hard hat worn by the technician.

6. The self-contained hands free electrical signal measurement device recited in claim 1 wherein the integrated visual display and audio link comprise a chest mounted visual display, a microphone and a miniature speaker.

7. The self-contained hands free electrical signal measurement device recited in claim 1 wherein the integrated visual display and audio link comprise an integrated visual display, a microphone and a miniature speaker and wherein the system unit and integrated visual display, microphone and miniature speaker are carried in a compartmentalized carrying case having a neck strp and a flap which, when lifted, reveals the integrated visual display, microphone and miniature speaker.

8. The hands free self-contained electrical signal measurement device recited in claim 1 wherein the spoken commands recognized by the speech recognition software running on the CPU include speaker independent words and speaker dependent words, the speech recognition software running on the CPU and associated circuitry having a training function for speaker dependent words.

9. The hands free self-contained electrical signal measurement device recited in claim 8 wherein speaker independent words are recognized by the speech recognition software running on the CPU to select among a predetermined number of designated users.

10. The self-contained hands free electrical signal measurement device recited in claim 9 wherein in the speaker dependent words recognized by the speech recognition software running on the CPU for a selected one of the predetermined number of designated users include words meaning "tune" and "range", the software responding to the word meaning "tune" to activate a tune mode in which the technician can navigate tuning the device for a measurement by a predetermined script of spoken commands and the software responding to the word meaning "range" to activate a range mode in which the technician can navigate selecting a range for a measurement by a predetermined script of spoken commands.

11. The self-contained hands free electrical signal measurement device recited in claim 10 wherein the speaker dependent words recognized by the speech recognition software running on the CPU for a selected one of the number of designated users include words meaning "scale" and "zoom", the software responding to the word meaning "scale" to activate a scale mode in which the technician can navigate scaling the display of a measurement by a predetermined script of spoken commands and the software responding to the word meaning "zoom" to activate a zoom mode in which the technician can navigate selecting an expansion or compression the display of a measurement by a predetermined script of spoken commands.

12. The self-contained hands free electrical signal measurement device recited in claim 11 wherein in the speaker dependent words recognized by the speech recognition software running on the CPU for a selected one of the predetermined number of designated users include words meaning "hum" and "CNR", the software responding to the word meaning "hum" to activate a hum mode in which the technician can navigate a hum measurement by a predetermined script of spoken commands and the software responding to the word meaning "CNR" to activate a range mode in which the technician can navigate selecting a carrier to noise measurement by a predetermined script of spoken commands.

13. The self-contained hands free electrical signal measurement device recited in claim 9 wherein in the speaker dependent words recognized by the speech recognition software running on the CPU for a selected one of the predetermined number of designated users include words meaning "CAD" and "TP", the software responding to the word meaning "CAD" to activate a comparative analysis test mode in which the technician can navigate a comparative analysis measurement by a predetermined script of spoken commands and the software responding to the word meaning "TP" to activate a test point mode in which the technician can navigate selecting a test point offset measurement by a predetermined script of spoken commands.

14. The self-contained hands free electrical signal measurement device recited in claim 9 wherein in the speaker dependent words recognized by the speech recognition software running on the CPU for a selected one of the predetermined number of designated users include a word meaning "store", the software responding to the word meaning "store" to activate a store mode in which the technician can navigate storing digitized measurement data in memory by a predetermined script of spoken commands.

15. The self-contained hands free electrical signal measurement device recited in claim 1 further comprising in the system unit a speech synthesizer generating audio feedback messages to the technician.

* * * * *